United States Patent [19]
Michael

[11] Patent Number: 5,815,001
[45] Date of Patent: Sep. 29, 1998

[54] INTEGRATED CIRCUIT BOARD WITH BUILT-IN TERMINAL CONNECTION TESTING CIRCUITRY

[75] Inventor: Ewald Michael, Haar, Germany

[73] Assignee: Siemens Aktiengesellschaft, Munich, Germany

[21] Appl. No.: 617,125

[22] Filed: Mar. 18, 1996

[30] Foreign Application Priority Data

Mar. 16, 1995 [EP] European Pat. Off. .............. 95103881

[51] Int. Cl.$^6$ ................................................. G01R 31/02
[52] U.S. Cl. .......................................... 324/763; 371/15.1
[58] Field of Search .................................... 324/763, 765, 324/537, 538, 158.1; 371/22.3, 22.4, 22.6, 15.1; 364/550, 551.01

[56] References Cited

U.S. PATENT DOCUMENTS

| | | | |
|---|---|---|---|
| 3,867,693 | 2/1975 | Saxenmeyer, Sr. . | |
| 4,220,917 | 9/1980 | McMahon, Jr. ........................ | 324/537 |
| 4,441,075 | 4/1984 | McMahon .............................. | 371/22.3 |
| 4,504,784 | 3/1985 | Goel et al. ............................ | 371/22.3 |
| 4,509,008 | 4/1985 | DasGupta et al. .................... | 371/22.3 |
| 4,894,605 | 1/1990 | Ringleb et al. . | |
| 4,963,824 | 10/1990 | Hsieh et al. ........................... | 324/763 |

FOREIGN PATENT DOCUMENTS 0 008 002  2/1980  European Pat. Off. .

*Primary Examiner*—Vinh P. Nguyen
*Attorney, Agent, or Firm*—Herbert L. Lerner; Laurence A. Greenberg

[57] ABSTRACT

A board includes two integrated circuits each having first terminals, second terminals, one basic configuration and one test configuration. The basic configurations contain components performing functions during normal operation of the circuits for which a particular circuit is intended. Each of the basic configurations has inputs and outputs connected to the terminals. Each of the test configurations has inputs and at least one output. Each of the inputs is connected to a respective one of the first terminals for supplying test signals to the test configuration, during a test mode of each of the circuits. The outputs are connected to the second terminals for transmitting result signals from the test configuration to the second terminals. The test and result signals are unaffected by the basic configurations during application of the test and result signals. First board contact surfaces are connected to the first terminals, for applying the test signals to the first board contact surfaces having an electrical connection with a respective one of the first terminals to be tested. Second board contact surfaces are connected to the second terminals, for picking up the result signals. A first terminal of both of the circuits is electrically connected together for simultaneously testing through the first board contact surfaces. The second terminals associated with the first terminals through the test configurations are electrically separated from one another.

9 Claims, 3 Drawing Sheets

INTEGRATED CIRCUIT BOARD WITH BUILT-IN TERMINAL CONNECTION TESTING CIRCUITRY

BACKGROUND OF THE INVENTION

1. Field of the Invention

The invention relates to a board with two integrated circuits.

As a rule, boards on which a plurality of integrated circuits are mounted are subjected to function testing in the factory, after being made. When planning such function testing, an important goal is to shorten test times. Typically, the individual testing steps are therefore carried out successively in such a way that errors which occur frequently are detected as early as possible, so that later testing steps can be dispensed with. Accordingly, tests that pertain to particularly error-prone functions are performed first.

In function testing of individual integrated circuits, it is known to perform a check of an electrical connection of the terminals of the integrated circuit with those of an automatic tester, as a first step. As a rule, contact testing of that kind is carried out in such a way that certain potentials are applied to the contacts of the automatic tester connected to the terminals of the integrated circuit, and the currents that then occur are measured. If the current values for an intact electrical connection are known, then a statement about the electrical connection can be made during the testing mode, from the current values being measured. If it is found that the electrical connection with one or more of the IC terminals is not intact, further function testing is unnecessary.

It would be desirable to carry out testing of the electrical connection between the terminals of a plurality of integrated circuits mounted on the same board and the corresponding contact surfaces of the board. However, the problem then arises that particularly when identical ICs are mounted on the board (in so-called modular boards, for instance, which have memory chips), terminals of different ICs are connected to one another through the board. Examples of this are common address terminals of the ICs. Therefore, an attempt to check contacts with the method described above for an individual IC fails. Since the entire circuit is more complex, the currents to be expected can only be determined with difficulty, and the mutual influence of the ICs is too great. Moreover it is not possible to find out at which of the ICs a contacting error has occurred.

U.S. Pat. No. 3,867,693 shows an integrated circuit with a test circuit for checking contacts between terminals of that individual integrated circuit and testing tips.

U.S. Pat. No. 4,894,605 shows an object in which contact checking of a plurality of integrated circuits mounted on a board is performed. In that prior art, testing of interconnected terminals of the integrated circuits is carried out sequentially, or in other words in chronological succession. All that is ever tested simultaneously is one of the terminals.

In Published European Patent Application EP 0 008 002 A1, electrical connections between a plurality of integrated circuits on a common substrate can be tested. For that purpose, each of the integrated circuits has a special terminal ("common output terminal"), which is needed there in addition to the otherwise necessary terminals of the integrated circuits.

SUMMARY OF THE INVENTION

It is accordingly an object of the invention to provide a board with two integrated circuits, which overcomes the hereinafore-mentioned disadvantages of the heretofore-known devices of this general type and in which contact testing of terminals of a plurality of such integrated circuits mounted on the board is made possible.

With the foregoing and other objects in view there is provided, in accordance with the invention, a board, comprising two integrated circuits each having first terminals, second terminals, one basic configuration and one test configuration; said basic configurations containing components performing functions during normal operation of said integrated circuits for which a particular circuit is intended; each of said basic configurations having inputs each being connected to one of said terminals of one of said integrated circuits, and each of said basic configurations having outputs each being connected to one of said terminals of one of said integrated circuits; each of said test configurations having inputs and at least one output, each of said inputs of said test configurations being connected to a respective one of said first terminals for supplying test signals applied to said first terminals to said test configuration, during a test mode of each of said integrated circuits; each of said outputs of said test configurations being connected to a respective one of said second terminals for transmitting result signals from said test configuration to said second terminals, as a function of the test signals; the test and result signals being unaffected by said basic configurations during application of the test and result signals; first board contact surfaces each being connected to a respective one of said first terminals, for applying the test signals to a respective one of said first board contact surfaces having an electrical connection with a respective one of said first terminals to be tested; second board contact surfaces each being connected to a respective one of said second terminals, for picking up the result signals at said second board contact surfaces; one of said first terminals of both of said integrated circuits being electrically connected together for simultaneously testing through a respective one of said first board contact surfaces; and said second terminals associated with said first terminals through said test configurations being electrically separated from one another.

Each of the integrated circuits located on the board has a basic configuration, which is connected to the terminals of the integrated circuit. The basic configuration is used to perform all of the functions that the integrated circuit is to perform, outside a special testing mode.

In addition to the basic configuration, the integrated circuits have an additional test configuration, which transmits corresponding result signals to one or more second terminals of the IC, when test signals are present at first terminals of the IC. If contact checking of ICs mounted on a board is to be carried out unequivocally, then the test signals must be applied to first contact surfaces of the board having an electrical connection with the first terminals of the IC which is to be checked. The result signals can then be picked up at the contact surfaces of the board that are connected to the second terminals of the IC. The result signals for test signals can be output in succession from the same output of the test configuration to various inputs of the test configuration. It is also possible, for test signals that are applied simultaneously to a plurality of inputs of the test configuration, to output one common result signal to one output of the test configuration.

The prerequisite for obtaining unequivocal result signals and therefore unequivocal statements about the electrical connection of the terminals of the IC is that result signals present at the second contact surfaces of the board not be adulterated by other signals. Therefore, only contact surfaces that have no electrical connection to points of the board that are simultaneously occupied with signals during contact checking which adulterate the result signals, can be used as the second contact surfaces. In particular, no second contact surface can be allowed to be connected to a first contact surface at which test signals that interfere with the result signal are applied during the application of the result signal to the second contact surface. Nor can a plurality of second contact surfaces, at which identical result signals are simultaneously present, be allowed to be connected to one another. However, if two result signals differ, for instance in terms of their frequency, then both can also appear simultaneously at second contact surfaces that are connected to one another. Two such different result signals can also be superimposed in one IC at the same second terminal.

With the board according to the invention it is possible to ascertain from the result signals which ICs have electrical connections that are not intact.

With the invention it is possible not only to check the electrical connection between the contact surfaces and the first terminals but also simultaneously, the electrical connection between these terminals and the interior of the IC. This connection is usually made through bond wires to form so-called bond paths. The electrical connection by a bond wire between one of the first terminals and a corresponding bond pad that is connected to one of the inputs of the test configuration can thus be checked as well.

Further embodiments of the invention are defined by the dependent claims.

Other features which are considered as characteristic for the invention are set forth in the appended claims.

Although the invention is illustrated and described herein as embodied in a board with two integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
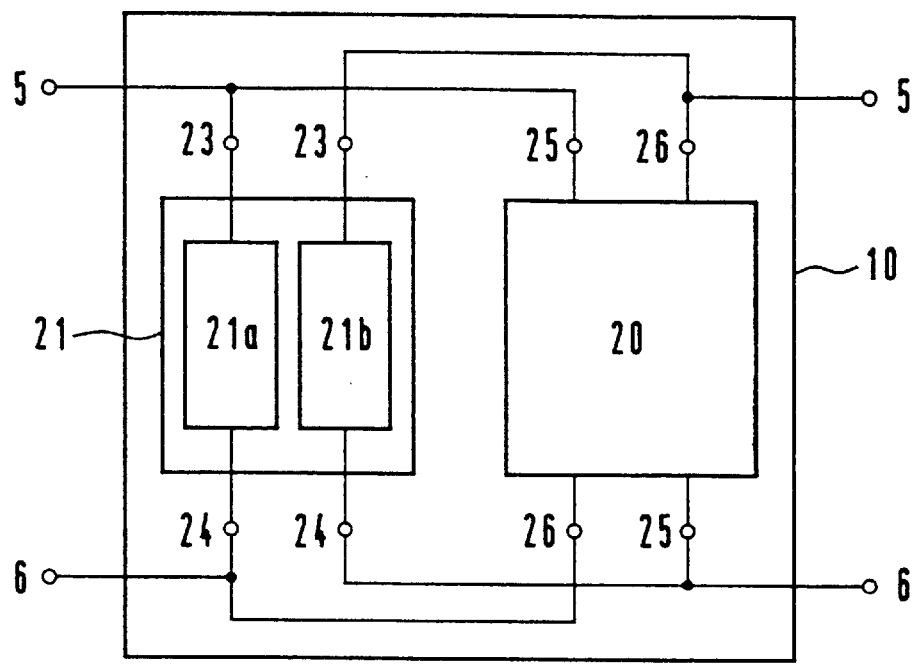
FIG. 1 is a block circuit diagram of an exemplary embodiment of one of the integrated circuits located on a board.

Referring now to the figures of the drawings in detail and first, particularly, to FIG. 1 thereof, there is seen an integrated circuit 10, which has two first terminals 5, two second terminals 6 and a basic configuration 20. The basic configuration 20 is intended to contain all of the circuit components that are necessary to assure the functions that the integrated circuit 10 is to perform during normal operation. The basic configuration 20 has two inputs 25 and two outputs 26, each of which is connected to a respective one of the first or second terminals 5 or 6.

In addition to the basic configuration 20, the circuit 10 has a test configuration 21 for performing contact checking of the terminals 5 of the circuit 10 during a testing mode. The test configuration 21 has two inputs 23 and two outputs 24. The inputs 23 of the test configuration 21 are connected to the first terminals 5, and the outputs 24 are connected to the second terminals 6. In this exemplary embodiment, one of the inputs 23 of the test configuration 21 is connected to one of the inputs 25 of the basic configuration 20, and another of the inputs 23 of the test configuration 21 is connected to one of the outputs 26 of the basic configuration 20. Similarly, one of the outputs 24 of the test configuration 21 is connected to another of the inputs 25, and another of the outputs 24 of the test configuration 21 is connected to another of the outputs 26 of the basic configuration 20.

Test signals can be applied to the first terminals 5 which are connected to the inputs 23 of the test configuration 21. Upon receiving the test signals, the test configuration 21 transmits corresponding result signals to the second terminals 6 which are connected to its output 24.

In order to provide the function of the integrated circuit 10 according to the invention, it does not matter whether the first terminals 5 and the second terminals 6 are connected to the inputs 25 or the outputs 26 of the basic configuration 20. All that is necessary is that in the testing mode, both the test signals and the result signals not be affected by the basic configuration 20.

In order to ensure that the result signals will not be affected by output signals of the basic configuration 20, the outputs 24 of the test configuration 21 can be connected with only the inputs 25 of the basic configuration 20.

By way of example, this can be accomplished by deactivating the basic configuration 20 during contact checking, for example by not applying any supply potential to the circuit 10. The basic configuration 20 could also be put in an inactive state by the use of special control signals, such as $\overline{\text{CAS}}$ (column address strobe) and $\overline{\text{RAS}}$ (row address strobe) in dynamic memories. For instance, if the outputs 26 of the basic configuration 20 are tristate outputs, then they can be put in a high-impedance state. A special testing mode could also be provided, in which the outputs 26 of the basic configuration 20 are deactivated.

In order to ensure that the test configuration 21 will not impair the function of the basic configuration 20 during normal operation, the test configuration 21 could be constructed in such a way that it is inactive in normal operation and is activatable only during the checking, through the use of an activation signal C. The activation signal C may be an output signal of a test mode detection circuit 22 shown in FIG. 5.

The potential of the test signals and/or of the result signals may also differ from the potential of the signals applied during normal operation to the corresponding terminals 5, 6. In this way it is easy, for instance by using diodes, to assure that the test and the result signals will affect only the test configuration 21, or during normal operation of the signals applied externally to the circuit 10, they will affect only the basic configuration. Embodiments of corresponding test configurations 21 will be described below, in conjunction with FIGS. 3 and 4.

In FIG. 1, the test configuration 21 which is shown as a block is further divided into two components 21a and 21b. These components 21a, 21b can, for instance, be constructed in accordance with the exemplary embodiments of FIG. 3 or FIG. 4. In FIG. 1, each of the first terminals 5 is connected through a respective one of the inputs 23, a respective one of the components 21a, 21b of the test configuration 21 and a respective one of the outputs 24, to a respective one of the second terminals 6.

Figure 2:
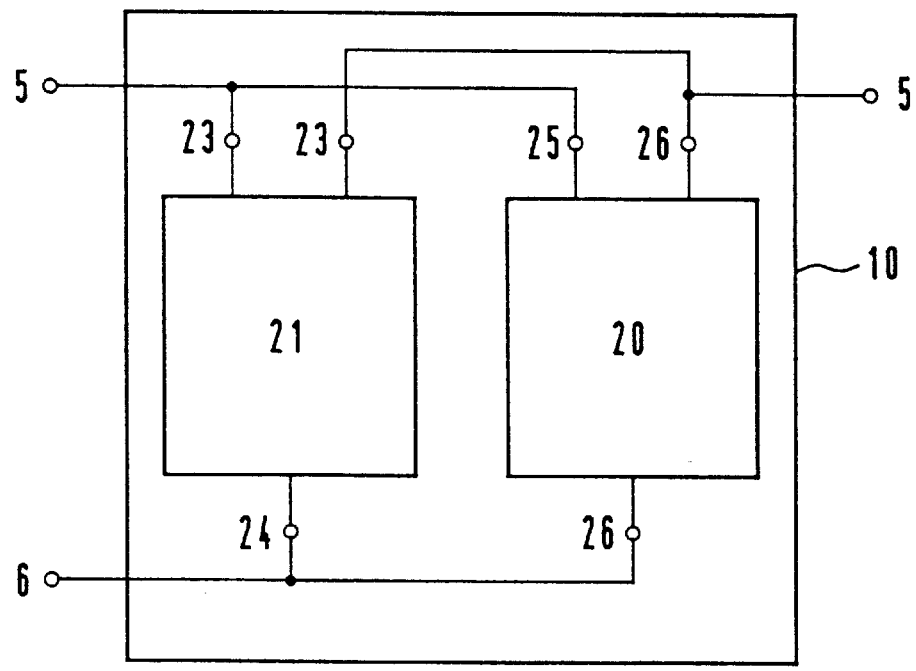
FIG. 2 is a block circuit diagram of another exemplary embodiment of the integrated circuit.
Figure 5:
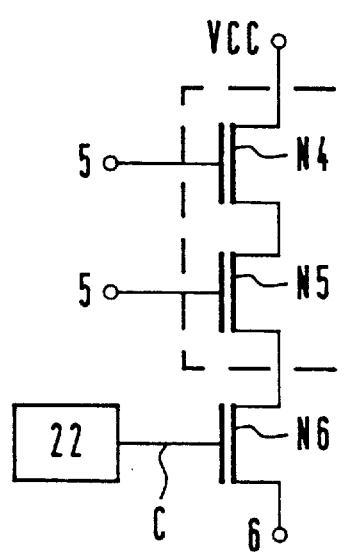
Figure 6:
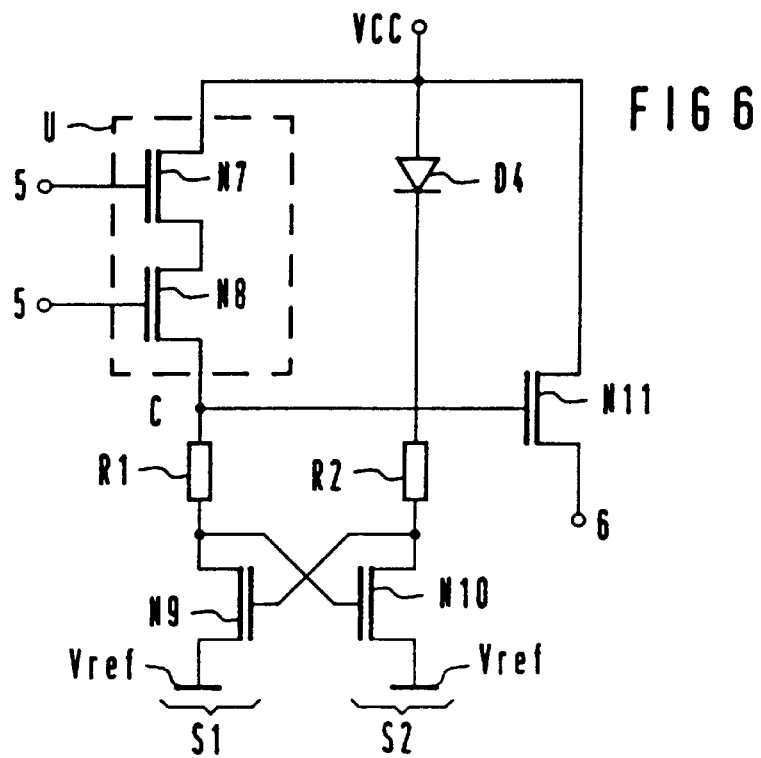

Conversely, FIG. 2 shows an exemplary embodiment in which two first terminals 5 are each connected to one respective input 23 of the test configuration 21, while the test configuration 21 has only one output 24 which is connected to a second terminal 6. In this case, the test configuration 21 transmits a corresponding result signal to the same second terminal 6, for test signals applied to both first terminals 5. Contact checking of the first terminals 5 can be carried out successively or simultaneously. In the latter case, linkage of the test signals through an AND linkage U disposed in the test configuration 21, for example, is suitable. Such AND linkages U are, for instance, a component of the exemplary embodiments of the test configurations 21 that are shown in FIGS. 5 and 6 and described below.

Figure 3:
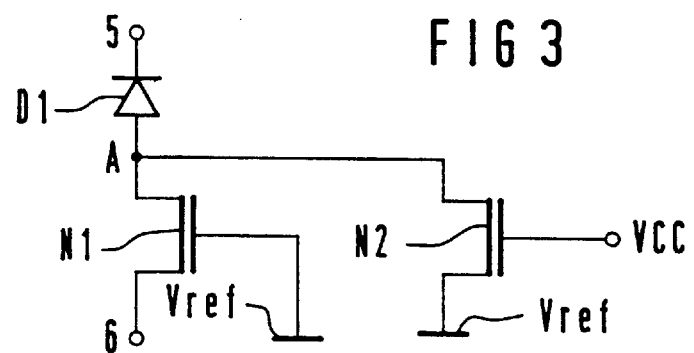
FIGS. 3–6 are schematic circuit diagrams of exemplary embodiments of test configurations contained in the integrated circuits.

FIG. 3 shows an exemplary embodiment of the test configuration 21, in which the potential of the test signals and the result signals is negative as compared with a reference potential, ground, of the circuit 10. In normal operation, the signals at the first and second terminals 5 and 6, respectively, can conversely have positive potentials. In this way, in this exemplary embodiment, deactivation of the test configuration 21 during normal operation is achieved.

A cathode of a first diode D1 is connected to one of the first terminals 5. An anode of the first diode D1 is connected through a first circuit node A and a channel path of a first n-channel field effect transistor N1, to one of the second terminals 6. A gate of the first field effect transistor N1 is connected to a reference potential Vref of the circuit 10. The first circuit node A is connected through a channel path of a second n-channel field effect transistor N2 to the reference potential Vref. A gate of the second field effect transistor N2 is connected to a supply potential VCC of the circuit 10. The reference potential Vref may, for instance, be ground.

Through the use of the second field effect transistor N2, the potential at the first circuit node A is kept at the reference potential Vref during normal operation of the integrated circuit 10, in which the signals applied to the first terminal 5 are positive relative to the reference potential Vref. If test signals that are negative relative to the reference potential Vref are applied to the first terminal 5 in the test mode, then given suitable dimensioning of te field effect transistors N1 and N2 and of the first diode D1, the negative potential of the test signal is established at the circuit node A. The first field effect transistor N1 is opened, so that the test signal established at the circuit node A is switched through to the second terminal 6. In this exemplary embodiment, the signals at the second terminal 6 are positive during normal operation relative to the reference potential Vref, so that the first field effect transistor N1 blocks.

The first diode D1 in FIG. 3 may, for instance, be constructed as a suitably connected field effect transistor. In order to enable checking of a plurality of first terminals 5 in succession, it is possible for each of them to be connected to the circuit node A through a respective first diode D1.

Figure 4:
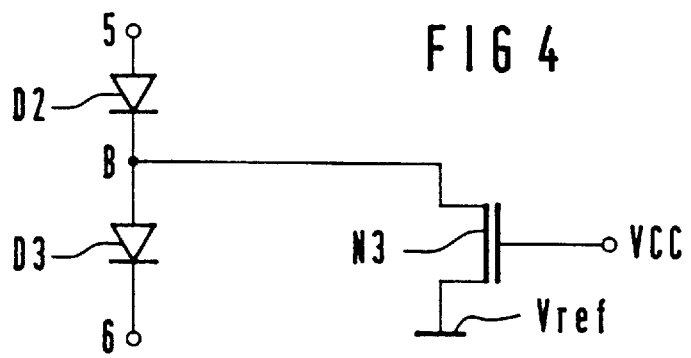

FIG. 4 shows an exemplary embodiment of a test configuration 21, in which the signals at the first terminal 5 in normal operation have a potential that is negative relative to the reference potential Vref. The test signals, conversely, have a potential which is positive relative to the reference potential Vref. An anode of a second diode D2 is connected to one of the two first terminals 5, while a cathode of the second diode D2 is connected through a second circuit node B to an anode of a third diode D3. A cathode of the third diode D3 is connected to one of the second terminals 6. The second circuit node B is connected through a third n-channel field effect transistor N3 to the reference potential Vref. A gate of the third field effect transistor N3 is connected to the supply potential VCC.

The second diode D2 and the third diode D3 can again be constructed as suitably connected field effect transistors. In order to enable successive testing of a plurality of first terminals 5 and using the same second terminal 6 for the corresponding result signals, each of the first terminals 5 can be connected through a respective second diode D2 to the second circuit node B. FIG. 5 shows a further exemplary embodiment of a test configuration 21, in which the potentials of the test and result signals are positive relative to the reference potential Vref. This exemplary embodiment is suitable for simultaneous testing of a plurality of first terminals 5. Each of the two first terminals 5 is connected to the gate of a fourth n-channel field effect transistor N4 or a fifth n-channel field effect transistor N5. Channel paths of the fourth and fifth field effect transistors N4 and N5 are disposed in series between the supply potential VCC and the second terminal 6. An AND linkage U of the two first terminals 5 is provided through the use of the two field effect transistors N4 and N5. Due to the inclusion of a sixth n-channel field effect transistor N6 between the AND linkage U, which is connected to the supply potential VCC, and the second terminal 6, the test configuration 21 can be activated in the test mode upon triggering of the sixth field effect transistor N6 through its gate, through the use of an activation signal C. The activation signal C may, for instance, be an output signal of a test mode detection circuit 22. The test mode detection circuit 22 may, for instance, be activated by the application of an additional test code to terminals of the circuit 10. FIG. 6 shows another exemplary embodiment of a test configuration 21, in which the potentials of the test and result signals are positive relative to the reference potential Vref. In this exemplary embodiment as well, two first terminals 5 can be tested simultaneously, through an AND linkage U which is formed from the series circuit of a seventh field effect transistor N7 and an eighth n-channel field effect transistor N8. The AND linkage U is connected on one hand to the supply potential VCC and on the other hand to a third circuit node C. The third circuit node C is connected to the reference potential Vref through a first resistor R1 and the channel path of a ninth n-channel field effect transistor N9. The supply potential VCC is also connected to the reference potential Vref, through a fourth diode D4, for instance constructed as a field effect transistor, and through a second resistor R2 and the channel path of a tenth n- channel field effect transistor N10. The drain of the ninth field effect transistor N9 is connected to the gate of the tenth field effect transistor N10, and vice versa. The first supply potential VCC is also connected to a second terminal 6 through the channel path of an eleventh n-channel field effect transistor N11. The gate of the eleventh field effect transistor N11 is connected to the third circuit node C.

In normal operation, the signals at the two first terminals 5 must not simultaneously exceed a certain threshold above the reference potential Vref. This threshold depends on the circuit dimensioning (for example, inception voltages of the transistors). Then, through the use of the flip-flop formed by the seventh field effect transistor N7 and the eighth field effect transistor N8, the potential at the third circuit node C is kept at the reference potential Vref. As a result, when there are signals at the second terminal 6 that are greater than or equal to the reference potential Vref, the eleventh field effect transistor N11 blocks. If in the testing mode positive test signals are present at both first terminals 5, then the third circuit node C is connected to the supply potential VCC. The flip-flop switches over and the eleventh field effect transistor N11 connects the second terminal 6 to the supply potential VCC.

Figure 7:
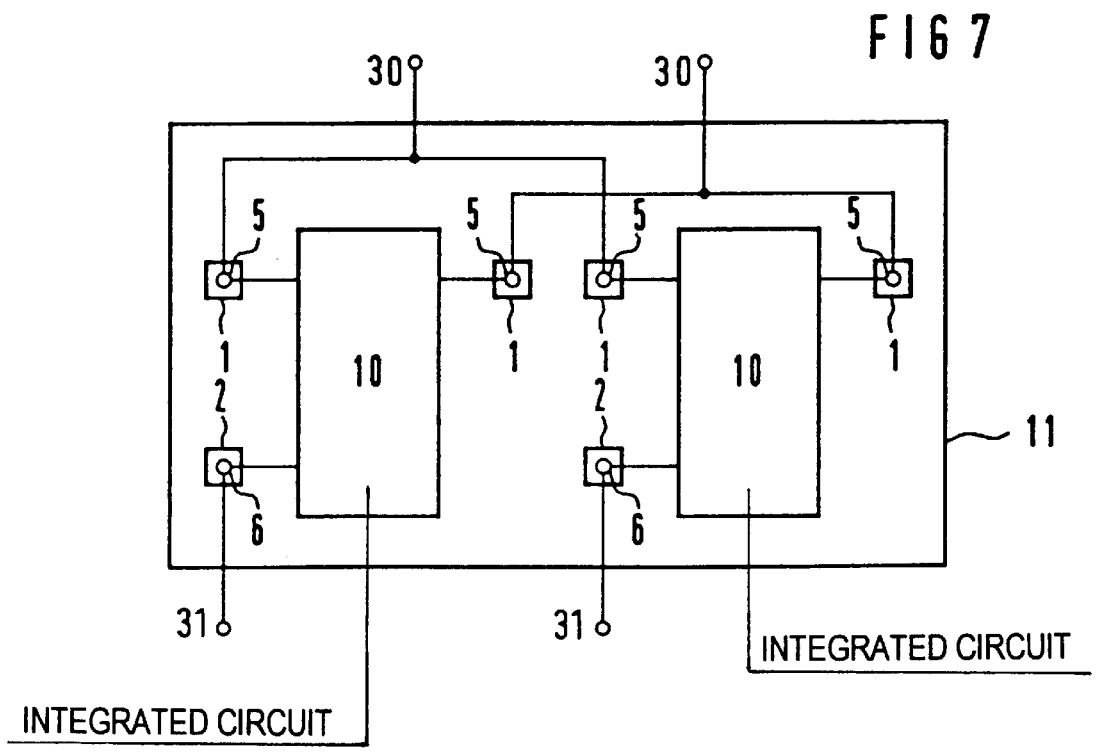
FIG. 7 is a block circuit diagram of an exemplary embodiment of the board according to the invention.

FIG. 7 shows a board 11 on which two of the integrated circuits 10 of the invention are mounted. The first terminals 5 are connected to first contact surfaces 1, and the second terminals 6 are connected to second contact surfaces 2, of the board 11. In the exemplary embodiment shown in FIG. 7, two identical integrated circuits 10 as in FIG. 2 are involved. In each of them, two of the first terminals 5 are connected to one another through the corresponding first contact surfaces 1 and connecting lines disposed on the board 11, and are also each connected to one first external terminal 30 of the board 11. The second terminals 6 that furnish the result signals are connected through the corresponding second contact surfaces 2 to second external terminals 31 of the board 11.

In order to perform contact checking of the integrated circuits 10 mounted on the board 11, test signals are now applied to the first external terminals 30. If the electrical connection exists between the first contact surfaces 1 and the first terminals 5 and between the corresponding second terminals 6 and the second contact surfaces 2, then the corresponding result signals can be recorded at the second external terminals 31.

In other embodiments, the first external terminals 30 and/or the second external terminals 31 may be dispensed with. In that case, the test signals or result signals must be applied and picked up, respectively, directly through contact tips and corresponding contact points on the board 11.

If unambiguous results of the contact checking are to be attainable, it is necessary that the signals established at the second contact surfaces 2 on the basis of the result signals be unequivocally ascribed to the corresponding result signals. If this is possible without adulteration thereof, then it is possible for other signals to be superimposed on the result signals at the second contact surfaces 2.

In particular, none of the second terminals 6 can be allowed to be connected through the board 11 to another of the second terminals 6 that at the same time during the test mode has identical result signals and intact electrical connections, because in that case it is not possible to determine whether one of these second terminals is failing to furnish a result signal because of a defective electrical connection.

Adulteration of the result signals can advantageously be avoided if—as in FIG. 7—the second contact surfaces 2 are not connected to one another or to other contact surfaces. It is therefore especially simply with the board 11 of the invention and with the use in particular of identical integrated circuits 10 according to the invention which have interconnected first terminals 5 but separate second terminals 6, to carry out contact testing of the first terminals 5 and of the second terminals 6 as well.

The presence of the expected result signals at the corresponding second contact surfaces 2 is at the same time evidence of proper electrical connection between these second contact surfaces 2 and the second terminals 6 contacted with them.

I claim:

1. A board, comprising:
   two integrated circuits each having first terminals, second terminals, one basic configuration and one test configuration;
   said basic configurations containing components performing functions during normal operation of said integrated circuits for which a particular circuit is intended;
   each of said basic configurations having an input being connected to one of said first terminals and another input being connected to one of said second terminals of one of said integrated circuits, and each of said basic configurations having an output being connected to one of said first terminals and another output being connected to one of said second terminals of one of said integrated circuits;
   each of said test configurations having inputs and at least one output, each of said inputs of said test configurations being connected to a respective one of said first terminals for supplying test signals applied to said first terminals to said test configuration, during a test mode of each of said integrated circuits;
   each of said at least one output of said test configurations being connected to a respective one of said second terminals for transmitting result signals from said test configuration to said second terminals, as a function of the test signals;
   the test and result signals being unaffected by said basic configurations during application of the test and result signals;
   first board contact surfaces each being connected to a respective one of said first terminals, for applying the test signals to a respective one of said first board contact surfaces having an electrical connection with a respective one of said first terminals to be tested;
   second board contact surfaces each being connected to a respective one of said second terminals, for picking up the result signals at said second board contact surfaces;
   one of said first terminals of both of said integrated circuits being electrically connected together for simultaneously testing through a respective one of said first board contact surfaces; and
   said second terminals associated with said first terminals through said test configurations being electrically separated from one another.

2. The board according to claim 1, wherein one of said basic configurations is deactivatable during testing.

3. The board according to claim 1, including a test mode detection circuit supplying an activation signal as an output signal received by one of said test configurations and said activation signal activating said one of said test configurations to perform testing.

4. The board according to claim 1, wherein said test configurations each have an AND gate linking a plurality of said first terminals of one of said integrated circuits.

5. The board according to claim 1, wherein the test signals each have a potential, and signals applied during normal operation to said first terminals each have a potential, the potential of the test signals differs from the potential of the signals applied during normal operation to said first terminals, in one of said integrated circuits.

6. The board according to claim 1, wherein the result signals each have a potential, and signals applied during normal operation to said second terminals each have a potential, the potential of the result signals differs from the potential of the signals applied during normal operation to said second terminals, in one of said integrated circuits.

7. The board according to claim 5, wherein:
   the potentials of the test signals are negative relatives to a reference potential, in one of said integrated circuits;
   said test configuration has a series circuit including at least one first diode and a first n-channel field effect transistor, said series circuit being connected between one of said first terminals and one of said second terminals;

said first diode has a cathode connected to said first terminal;

said first field effect transistor has a gate connected to the reference potential;

said first diode and said first field effect transistor form a circuit node therebetween;

said test configuration has a second n-channel field effect transistor with a channel path connecting said circuit node to the reference potential; and said second field effect transistor has a gate connected to a supply potential.

8. The board according to claim 5, wherein:

the potentials of the test signals are positive relative to a reference potential, in one of said integrated circuits;

said test configurations each have a series circuit between one of said first terminals and one of said second terminals, said series circuit including at least one first diode and a second diode;

said at least one first diode has an anode connected to said first terminal and said second diode has a cathode connected to said second terminal;

said at least one first diode and said second diode form a circuit node therebetween;

said test configurations each have a third n-channel field effect transistor with a channel path connecting said circuit node to the reference potential; and said third field effect transistor has a gate connected to a supply potential.

9. The board according to claim 1, wherein: one of said integrated circuits includes a first series circuit and a second series circuit disposed between a supply potential and a reference potential;

said first series circuit has at least one first field effect transistor and one second field effect transistor of the n-channel type, one first resistor, and one third field effect transistor having a drain and a gate;

said second series circuit has at least one diode, one second resistor, and one fourth n-channel field effect transistor having a drain and a gate;

the drain of said third field effect transistor is connected to the gate of said fourth field effect transistor, and the drain of said fourth field effect transistor is connected to the gate of said third field effect transistor;

a fifth field effect transistor being disposed between the supply potential and said second terminal and having a gate;

said second field effect transistor and said first resistor form a circuit node connected to the gate of said fifth field effect transistor.

* * * * *